United States Patent
Fukunaga

(10) Patent No.: US 6,483,189 B1
(45) Date of Patent: Nov. 19, 2002

(54) SEMICONDUCTOR DEVICE

(75) Inventor: Hideki Fukunaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 537 days.

(21) Appl. No.: 08/989,339

(22) Filed: Dec. 11, 1997

(30) Foreign Application Priority Data

Jun. 19, 1997 (JP) .............................................. 9-162641

(51) Int. Cl.[7] .............................................. H01L 23/34
(52) U.S. Cl. ...................................... 257/730; 257/723
(58) Field of Search .............................. 257/676, 684, 257/687, 723, 724, 730

(56) References Cited

U.S. PATENT DOCUMENTS

| | | | |
|---|---|---|---|
| 5,373,188 A | | 12/1994 | Michii et al. |
| 5,552,966 A | * | 9/1996 | Nagano ....................... 361/813 |
| 5,821,618 A | * | 10/1998 | Graf et al. ................... 257/723 |

FOREIGN PATENT DOCUMENTS

| | | |
|---|---|---|
| JP | 1-308058 | 12/1989 |
| JP | 4-119640 | 4/1992 |
| JP | 4-188859 | 7/1992 |
| JP | 7-142673 | 6/1995 |

* cited by examiner

*Primary Examiner*—Olik Chaudhuri
*Assistant Examiner*—Douglas A. Wille
(74) *Attorney, Agent, or Firm*—Oblon, Spivak, McClelland, Maier & Neustadt, P.C.

(57) ABSTRACT

A semiconductor device comprising; two rectangular semiconductor chips, each function of which is different from each other; two die pads, a plurality of leads for carrying either of the two die pads, each of the plurality of leads being supported by a lead frame and being connected to either of the two die pads; a plurality of leads for connecting either of the two semiconductor chips with any of outer connection terminals; a package in which the two semiconductor chips are encapsulated; wherein the leads for carrying are provided at larger side faces of the package and at smaller side faces of the package; and wherein each of the two die pads is supported at at least three side faces of the package.

4 Claims, 3 Drawing Sheets

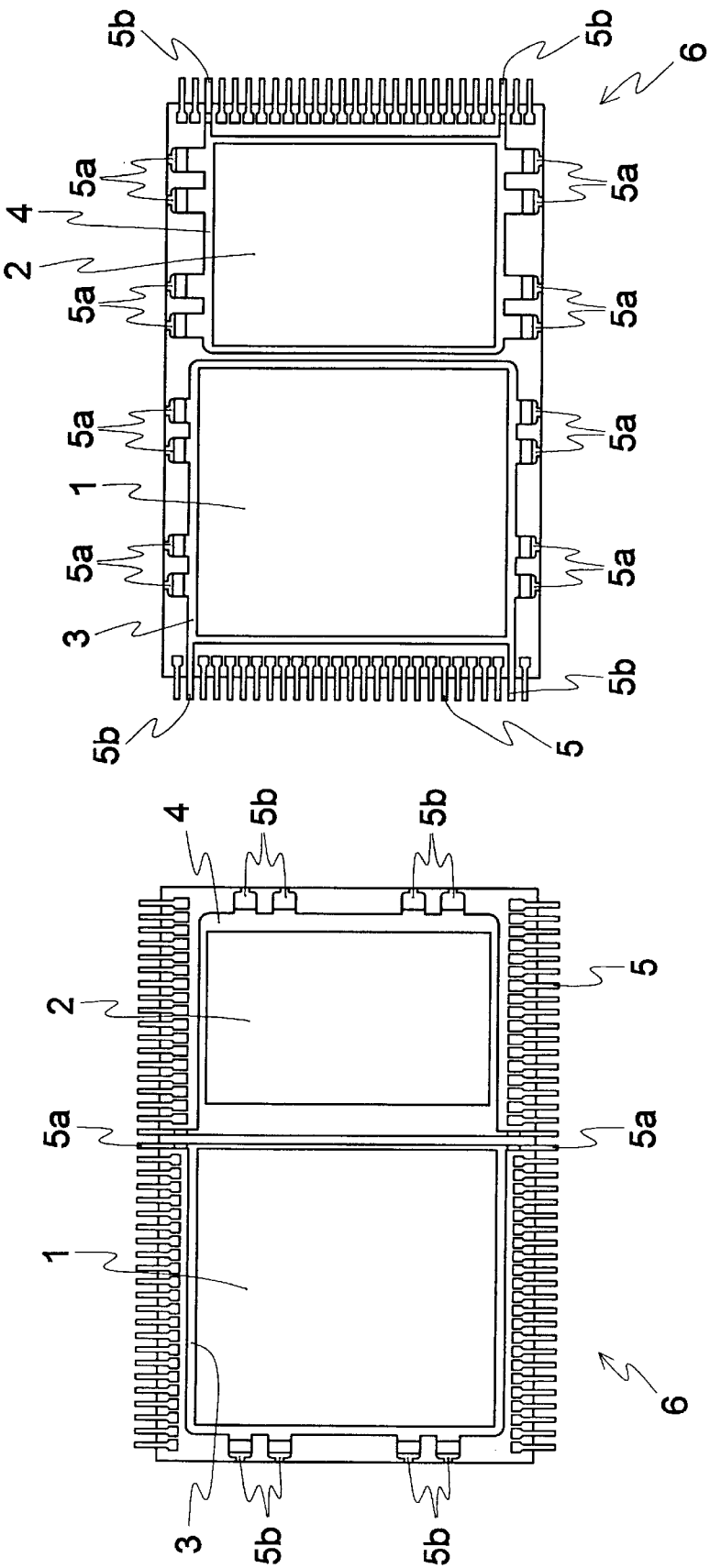

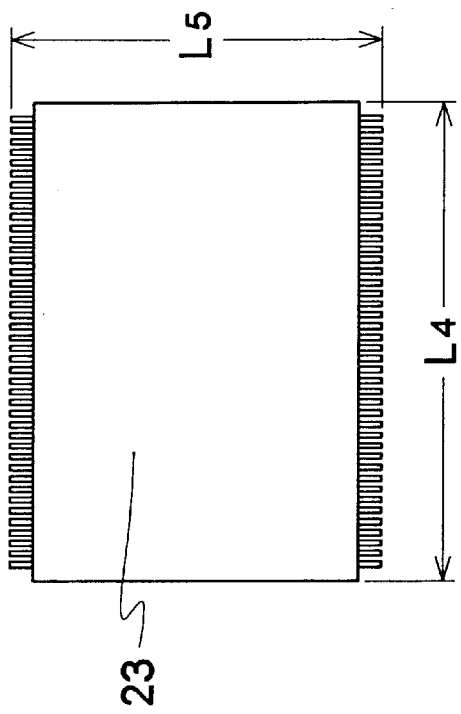
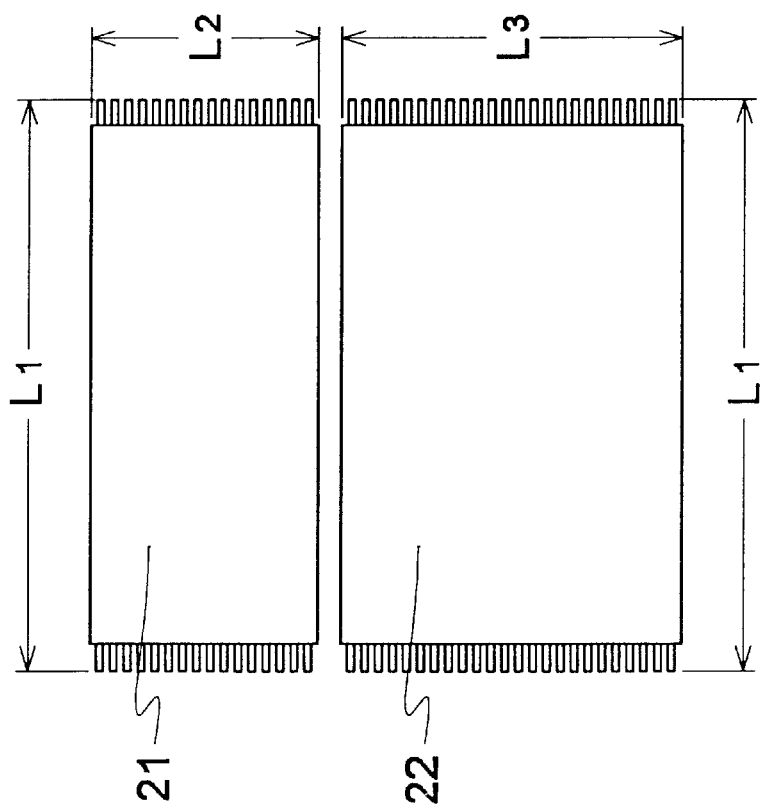
FIG. 2(a)
FIG. 2(b)

SEMICONDUCTOR DEVICE

BACKGROUND OF THE INVENTION

The present invention relates to a semiconductor device in which semiconductor chips are encapsulated by synthetic resin. More particularly, the present invention relates to a semiconductor device in which a plurality of semiconductor chips are provided in one semiconductor package (hereinafter referred to as a package).

Two kinds of semiconductor chips, each function of which is different from each other, for example an SRAM and a flash memory, are encapsulated into two IC packages, each being different from each other respectively in the conventional art. However, the two kinds of semiconductor chips are not limited to the SRAM and the flash memory. Thus, two kinds of semiconductor chips are transported respectively from the semiconductor manufacturer. Under such circumstances, electrical instruments manufacturer who manufactures downsized "end products" purchase the semiconductor chips one by one and mount them on mother boards for end products respectively. Such downsized end product is, for example, a portable telephone and is an electrical apparatus including, for example, semiconductor devices according to the present invention.

Recently, a number of proposals are made in order to reduce an area for mounting packages as electrical instruments are downsized. Accordingly, in conventional art there is a problem that large area for mounting packages is required and that a demand that electrical instruments such as portable telephones are to be downsized is not satisfied since two packages must be mounted one by one respectively when mounting two kinds of semiconductor chips, each function of which is different from each other, as one set.

In order to solve the problem, proposals of a semiconductor device in which a plurality of semiconductor chips are encapsulated in one package are made in for example Japanese Unexamined Patent Publication No. 308058/1989 or in Japanese Unexamined Patent Publication No. 119640/1992. FIG. 4 is a sectional view illustrating conventional DIP.IC (dual inline package IC) in which semiconductor chips are encapsulated by synthetic resin. In FIG. 4, reference numeral 10 denotes a DIP.IC (electronic device); reference numeral 11 denotes a first pellet; reference numeral 12 denotes a second pellet; reference numeral 13 denotes a bonding wire; reference numeral 14 denotes a package in which semiconductor chips are encapsulated by synthetic resin; reference numerals 15a and 15b, each denoting a lead for carrying a tab (hereinafter referred to as tab-supporting lead), the lead is supported by a lead frame; reference numerals 16a and 16b denote tabs; reference numeral 17 denotes a lead; reference numeral 17a denotes an inner lead; reference numeral 17b denotes an outer lead; reference numeral 17c denotes a common inner lead; reference numeral 18 denotes a bonding layer. Tab-supporting leads 15a and 15b are provided in such a manner that tabs 16a and 16b are formed in a shape of a flat rectangular plate, and formed at each top end of the tab 15a and 15b, the tab-supporting leads being provided so that the tab-supporting leads are located on one straight line. Thus, each of tab-supporting leads 15a and 15b supports each of the tabs 16a and 16b respectively in one body.

In the conventional example, a plurality of pellets 11 and 12 are provided for an electric circuit for prescribed functions. The pellets are bonded on the tabs 16a and 16b respectively and encapsulated by resin into a single package. Thus, an electrical device is formed in one unit system with multiple functions.

In a semiconductor device in which a plurality of semiconductor chips are provided in one package, it is designed that an area for mounting a semiconductor device is reduced. However, since a lead frame which is used in fabricating a package includes a plurality of die pads (tab), there is a problem that in manufacturing steps many defects such as inclination of die pad from the plane on which the lead frame exists occurs.

In a semiconductor device proposed in the above-mentioned Unexamined Japanese Patent Publication No. 308058/1989, each of tab-supporting leads 15a and 15b, each of which is carrying tab 16a or 16b supported by a lead frame is provided at only one side of each tab respectively.

Thus, in the stability of the tab, there is a problem that the tab tends to incline from the plane on which lead frame exists.

Further, a structure in which two die pads are formed in a lead frame in such a manner that the pattern of the die pad is like an island and the pads are connected through an insulating circuit board and a semiconductor chip is provided on the pad respectively is proposed in the above-mentioned Unexamined Japanese Patent Publication No. 119640/1992. However, it is supposed that inclination of the pads occurs since the pad is supported at two points to the outer frame.

SUMMARY OF THE INVENTION

The present invention is achieved to solve the above-mentioned problems. The object of the present invention is to provide a semiconductor device so that on a mother board an area for mounting semiconductor device can be largely reduced.

According to the present invention, there is provided a semiconductor device comprising;

two rectangular semiconductor chips, each function of which is different from each other;

two die pads, each of which carries thereon either of the two rectangular semiconductor chips and is electrically isolated from each other;

a plurality of leads for carrying either of the two die pads, each of the plurality of leads being supported by a lead frame and being connected to either of the two die pads;

a plurality of leads for connecting either of the two semiconductor chips with any of outer connection terminals;

a package in which the two semiconductor chips, the two die pads, one portion of each of the leads for carrying and one portion of each of the leads for connecting are encapsulated by synthetic resin so that the two semiconductor chips are packed in a single package;

wherein the leads for carrying are provided at larger side faces of the package and at smaller side faces of the package; and wherein each of the two die pads is supported at at least three side faces of the package.

Preferably, at each of four side faces of the package at least two leads for carrying either of the two die pads are provided.

Preferably, the lead for carrying is provided in such a manner that the lead for carrying is directed outward at a smaller side face of the package and has an extended portion in the package and is connected to an other lead for carrying directed outward at a larger side face of the package.

Preferably, the lead for carrying is to be connected to an outer connection terminal which is electrically isolated from the two rectangular semiconductor chips.

Preferably, the two rectangular semiconductor chips comprise a flash memory and an SRAM.

In a semiconductor device, high stability and high reproducibility can be achieved and improved throughput in manufacturing steps can be obtained.

BRIEF DESCRIPTION OF THE DRAWINGS

FIG. 1(a) and FIG. 1(b) are plan views illustrating semiconductor device according to Embodiment 1 of the present invention;

FIG. 2(a) and FIG. 2(b) are plan views illustrating reduction effect of an area for mounting semiconductor device according to Embodiment 1 of the present invention;

DETAILED DESCRIPTION

Embodiment 1

Figure 3:
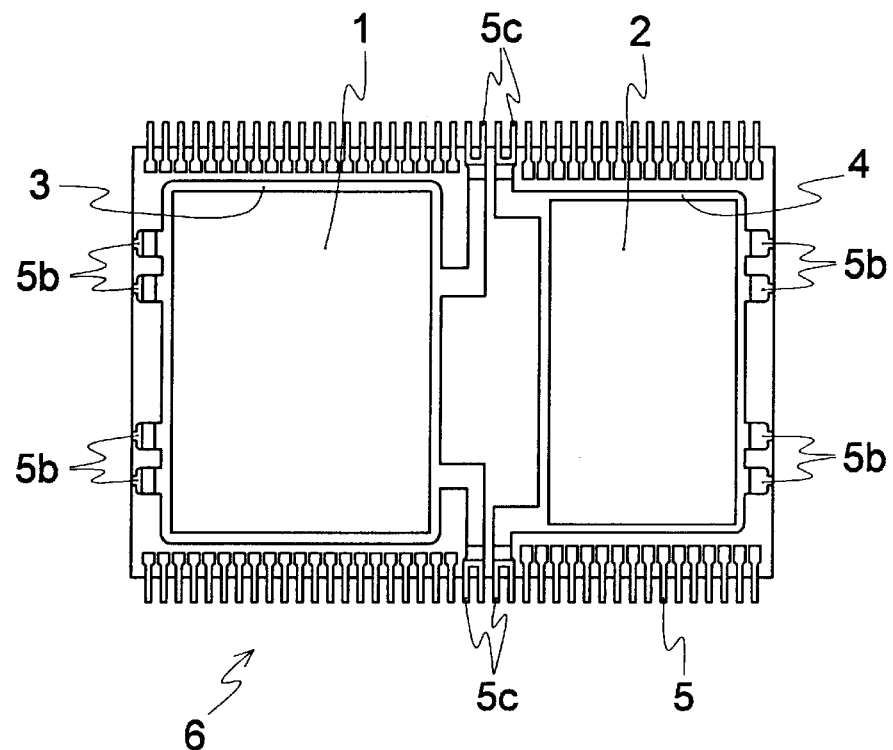
FIG. 3 is a plan view illustrating semiconductor device according to Embodiment 2 of the present invention.
Figure 4:
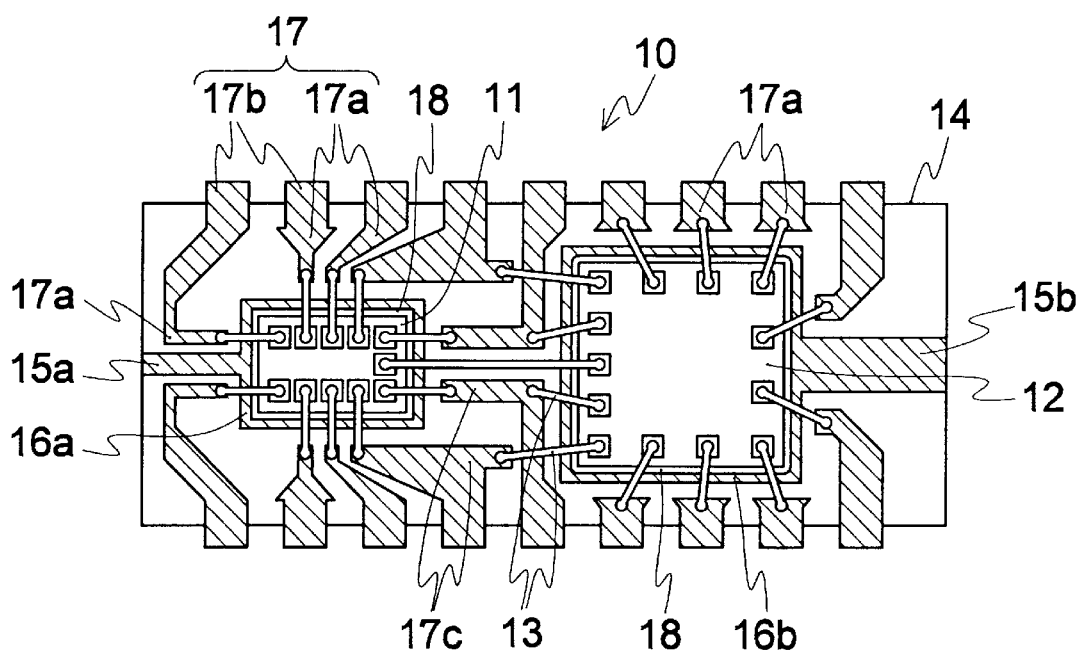
FIG. 4 is a plan view illustrating conventional semiconductor device.

Hereinafter, Embodiment 1 of the present invention is illustrated referring to the drawings. FIG. 1(a) and FIG. 1(b) are plan views illustrating semiconductor devices according to the present invention, i.e., thin small-outline package (TSOP) (II) and TSOP (I). In FIG. 1(a) and FIG. 1(b), reference numeral 6 denotes a semiconductor package (hereinafter referred to as package) which is a semiconductor device in which semiconductor chips are encapsulated by synthetic resin according to Embodiment 1. The shape of the package is a rectangular solid having four side faces, i.e., two larger faces and two smaller faces. According to the present invention, supporting leads described below are provided at both two larger faces and two smaller faces. Reference numeral 1 denotes a first semiconductor chip and reference numeral 2 denotes a second semiconductor chip. The two semiconductor chips are shaped into rectangle, having different function from each other. Reference numeral 3 denotes a die pad on which the first semiconductor chip 1 is provided. Reference numeral 4 denotes a die pad on which the second semiconductor chip 2 is provided. Die pads 3 and 4 are electrically isolated from each other. Reference numeral 5 is a lead which is connected through a wire to the first semiconductor chip 1 or the second semiconductor chip 2. Further, each of the lead 5 connects the first semiconductor chip 1 with an outer connection terminal (not shown) or connects the second semiconductor chip 2 with other outer connection terminal. Reference numeral 5a denotes a lead for carrying the die pad and the lead is supported by a lead frame (not shown). Hereinafter the lead is referred to as a supporting lead. The supporting lead 5a has a shape in which the supporting lead 5a locates and is directed outward at the larger side face of the package 6 and connects with the lead frame at the location. The supporting lead 5b has also a shape in which the supporting lead 5b locates and is directed outward at the smaller side face of the package 6 and connects with the lead frame. The supporting lead is made of Fe alloy or Cu alloy.

The package is formed in such a manner that two semiconductor chips, two die pads, one portion of each supporting lead and one portion of each lead are encapsulated by synthetic resin into one package. Thus, the two semiconductor chips are packed in one package. The lead frame is cut out and separated from the package after molding.

In this Embodiment, it is a feature of the present invention that the package 6 is supported at three locations in such a manner that the supporting leads 5a are provided at the larger side face of the package 6; the supporting leads 5b are provided at the smaller side face of the package 6; die pad 3 on which first semiconductor 1 is provided is supported at least three locations by means of at least three supporting leads; and die pad 4 on which second semiconductor 2 is provided is supported at at least three locations by means of at least three supporting leads.

An effect obtained from package 6 according to this Embodiment 1 of reducing an area for mounting package is shown in FIGS. 2(a) and 2(b).

FIG. 2(a) and FIG. 2(b) are plan views illustrating package 6 according to Embodiment 1 of the present invention in which an SRAM is provided as a first semiconductor chip 21 and a flash memory is provided as a second semiconductor chip 22. The kind of a memory to be provided is only illustrative. The two kinds of the semiconductor chips are not limited to the SRAM and the flash memory. FIG. 2(a) shows a case in which in conventional art two different packages are mounted on a mother board (not shown). In this case shown in FIG. 2(a), areas for mounting packages 21 and 22 are 160 mm$^2$ ($L_1 \times L_2 = 160$ mm$^2$, where $L_1 = 20$ mm and $L_2 = 8$ mm) and 240 mm$^2$ ($L_1 \times L_3 = 240$ mm$^2$, where $L_1 = 20$ mm and $L_3 = 12$ mm). Thus, area for mounting packages of 400 mm$^2$ in total is required.

FIG. 2(b) shows a case in which the two packages are integrated into one package in accordance with this Embodiment 1 in which an area for mounting semiconductor package 23 is 223 mm$^2$ ($L_4 \times L_5 = 223$ mm$^2$, where $L_4 = 17$ mm and $L_5 = 13.1$ mm). Thus, area for mounting package is reduced by 44% compared with the conventional one.

By adopting the package according to this Embodiment 1, for a manufacturer of end products the package allows to obtain downsized end products since area for mounting package according to Embodiment 1 of the present invention is reduced.

Further, in a manufacturer of end products the package allows to reduce manufacturing steps, thereby enchancing producibility since a manufacturer of end products has only to mount one package.

As mentioned above, in accordance with Embodiment 1 of the present invention, since supporting leads 5a are provided at larger side face of the package 6 and supporting leads 5b are provided at the smaller side face of the package 6, and die pad 3 on which first semiconductor chip 1 in rectangular shape is provided is supported at at least three sides of the die pad 3 and die pad 4 on which a second semiconductor chip 2 in rectangular shape is provided is supported at at least three sides of the die pad 4. Accordingly, occurrence of die pad's shift (displacement from a standard position) in assembling steps can be suppressed and a semiconductor package can be manufactured stably. Preferably, number of supporting leads 5a and 5b can be increased advantageously.

Namely, providing at least two supporting leads 5a and 5b at each of four side faces of package 6 enables to obtain a semiconductor device with high stability in manufacturing steps and with high reproducibility.

Embodiment 2

FIG. 3 is a plan view illustrating a semiconductor device according to Embodiment 2 of the present invention. In FIG.

3 the same parts as those or equivalent parts to those shown in FIG. 1(a), FIG. 1(b), FIG. 2(a) and FIG. 2(b) are denoted as the same reference numeral and explanation thereof is omitted. In this Embodiment 2, a supporting lead 5c is provided in such a manner that the supporting lead is directed outward from die pad 3 or die pad 4 at a smaller side face of package 6 and has an extended portion in the package 6 and is connected to an other supporting lead directed outward at the larger side face of package 6.

In FIG. 3, supporting lead 5c is connected to an outer connection terminal (not shown) isolated electrically from first semiconductor chip 1 or second semiconductor chip 2.

Accordingly, a lead 5 which is not required to be connected electrically with first semiconductor chip 1 or second semiconductor chip 2 is employed as supporting lead 5c.

In accordance with this Embodiment 2, supporting lead 5c is provided in a package in the above-mentioned manner that the supporting lead is directed outward from die pad 3 or die pad 4 at the smaller side face of package 6 and has an extended portion in the package 6 and is connected to an other supporting lead directed outward at the larger side face of package 6.

Thus, a gap is provided so that synthetic resin for molding such as, for example, epoxy resin can flow easily when manufacturing package 6, thereby improving movility of the synthetic resin in a step for assembling the package 6, in which the package is molded by synthetic resin.

Further, connecting supporting lead 5c with outer connection terminal which is not required to be connected electrically with first semiconductor chip 1 or second semiconductor chip 2 enables to assemble more effectively and stably.

As mentioned above, in accordance with the present invention, two semiconductor chips, each function of which is different from each other are provided in single package; supporting leads are provided at larger side faces and smaller side faces of the package; and a die pad on which semiconductor chip is carried is supported at at least three side faces of package by providing a supporting lead which is not required to be connected with outer connection terminal.

Thus, a semiconductor device in which occurrence ratio of defect is low and production is stable can be obtained. Further, in an end product in which this semiconductor device is employed, an area for mounting a semiconductor device can be reduced largely. This semiconductor device allows to obtain downsized end products and allows to reduce manufacturing steps and manufacturing cost, thereby improving producibility.

It should be understood that the apparatus and methods which have been shown and described herein are illustrative of the invention and are not intended to be limitative thereof. Clearly, those skilled in the art may conceive of variations or modifications to the invention. However, any such variations or modifications which falls within the purview of this description are intended to be included therein as well. The scope of the invention is limited only by the claims appended hereto.

What is claimed is:

1. A semiconductor device, comprising;

two rectangular semiconductor chips, each of the semiconductor chips having a different function;

two die pads, each of the die pads carrying one of the respective conductor chips thereon and being electrically isolated from each other;

a plurality of carrying leads configured to carry each of said two die pads, each of said plurality of carrying leads being supported by a lead frame and being connected to one or another of said two die pads;

a plurality of connecting leads configured to connect one or another of said two semiconductor chips with any of a group of outer connection terminals;

a synthetic resin package in which said two semiconductor chips, said two die pads, one portion of said carrying leads, and one portion of said connecting leads are encapsulated, said package having at least four side faces;

wherein each of said two die pads is supported at at least three side faces of said package by at least one separate carrying lead extending from each of the at least three faces; and wherein said package has at least two larger and at least two smaller side faces and each carrying lead is provided in such a manner that at least one of said carrying leads is directed outward at a smaller side face of said package and has an extended portion in said package that is connected to another carrying lead directed outward at a larger side face of said package.

2. The semiconductor device of claim 1, wherein at each of the four side faces of said package at least two separate carrying leads are provided for carrying each of said two die pads.

3. The semiconductor device of claim 1, wherein said carrying leads include a carrying lead configured to be connected to one of the outer connection terminals which is electrically isolated from said two rectangular semiconductor chips.

4. The semiconductor device of claim 1, wherein said two rectangular semiconductor chips comprise a flash memory and an SRAM.

* * * * *